United States Patent
Obata (10) Patent No.: US 12,024,776 B2
(45) Date of Patent: Jul. 2, 2024

(54) GAS SUPPLY APPARATUS, GAS SUPPLY METHOD, AND SUBSTRATE PROCESSING APPARATUS

(71) Applicant: Tokyo Electron Limited, Tokyo (JP)

(72) Inventor: Yuji Obata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/656,009

(22) Filed: Mar. 23, 2022

(65) Prior Publication Data

US 2022/0316060 A1 Oct. 6, 2022

(30) Foreign Application Priority Data

Apr. 1, 2021 (JP) .................................. 2021-062746

(51) Int. Cl.
*C23C 16/52* (2006.01)
*C23C 16/44* (2006.01)
*C23C 16/455* (2006.01)

(52) U.S. Cl.
CPC .......... *C23C 16/52* (2013.01); *C23C 16/4412* (2013.01); *C23C 16/45544* (2013.01); *C23C 16/45561* (2013.01); *C23C 16/45563* (2013.01)

(58) Field of Classification Search
CPC ................ C23C 16/52; C23C 16/4412; C23C 16/45544; C23C 16/45561; C23C 16/45563; C23C 16/34; C23C 16/455; C23C 16/45525; C23C 16/45557; H10K 71/16; H10K 71/00
See application file for complete search history.

(56) References Cited

U.S. PATENT DOCUMENTS

2017/0275757 A1 9/2017 Kikuchi et al.
2022/0316060 A1* 10/2022 Obata ................. C23C 16/4412

FOREIGN PATENT DOCUMENTS

| CN | 104906677 A | | 9/2015 | |
|----|----|----|----|----|
| CN | 107236937 A | | 10/2017 | |
| CN | 115198251 A | * | 10/2022 | ......... C23C 16/4412 |
| JP | 4057685 B2 | * | 3/2008 | |
| JP | 2020-004957 A | | 1/2020 | |
| JP | 2020-143351 A | | 9/2020 | |
| KR | 101376565 B1 | * | 4/2014 | |
| TW | 202013638 A | * | 4/2020 | ........... C23C 16/345 |
| TW | I723046 B | * | 4/2020 | |

* cited by examiner

Primary Examiner — Jeffrie R Lund
(74) Attorney, Agent, or Firm — Armstrong Teasdale LLP (57) ABSTRACT

A gas supply apparatus supplies a gas to a processing space where a gas processing is performed on a substrate. The gas supply apparatus includes: a gas supply source configured to supply a gas; a gas supply path configured to supply the gas to the processing space; an opening/closing valve configured to supply/stop the gas and provided in the gas supply path; a detector configured to detect a detectable index correlated with a Cv value of the opening/closing valve; an opening degree adjustment mechanism configured to adjust an opening degree of the opening/closing valve when the opening/closing valve is opened; and a controller configured to: store a relationship between the Cv value and the index; and control the opening degree by the opening degree adjustment mechanism such that when the index deviates from an appropriate range corresponding to an appropriate Cv value, the index falls within the appropriate range.

19 Claims, 8 Drawing Sheets

GAS SUPPLY APPARATUS, GAS SUPPLY METHOD, AND SUBSTRATE PROCESSING APPARATUS

CROSS-REFERENCE TO RELATED APPLICATION

This application is based upon and claims the benefit of priority from Japanese Patent Application No. 2021-062746, filed on Apr. 1, 2021, the entire contents of which are incorporated herein by reference.

TECHNICAL FIELD

The present disclosure relates to a gas supply apparatus, a gas supply method, and a substrate processing apparatus.

BACKGROUND

In related arts, in the manufacture of semiconductor devices, a technique of forming a film on a substrate through a chemical vapor deposition (CVD) method or atomic layer deposition (ALD) method has been known.

In this technique, a valve that opens/closes to perform gas supply and gas interruption is used in a gas supply line that supplies the gas. As the valve is repeatedly opened/closed, a Cv value, which is a characteristic value of the valve, changes due to wear, which may cause a gas supply amount to fluctuate and a film formation result to fluctuate. In particular, in the case of ALD, the frequency of opening/closing the valve is high, and thus the fluctuation in the film formation result becomes a problem.

Therefore, as a technique for preventing a change in a film formation result due to a change in the Cv value of a valve, Patent Document 1 proposes a technique for calculating the Cv value of the valve by executing a correction recipe for confirming the Cv value of the valve.

PRIOR ART DOCUMENT

Patent Document

Patent Document 1: Japanese Laid-Open Patent Publication No. 2020-4957

SUMMARY

According to one embodiment of the present disclosure, there is provided a gas supply apparatus that supplies a gas to a processing space in which a gas processing is performed on a substrate, the gas supply apparatus including: a gas supply source configured to supply a gas; a gas supply path configured to supply the gas from the gas supply source to the processing space; an opening/closing valve configured to supply/stop the gas and provided in the gas supply path; a detector configured to detect a detectable index correlated with a Cv value of the opening/closing valve; an opening degree adjustment mechanism configured to adjust an opening degree of the opening/closing valve when the opening/closing valve is opened; and a controller configured to: store a relationship between the Cv value of the opening/closing valve and the index; and control the opening degree of the opening/closing valve by the opening degree adjustment mechanism such that when the index deviates from an appropriate range corresponding to an appropriate Cv value, the index falls within an appropriate range.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Substrate Processing Apparatus

Figure 1:
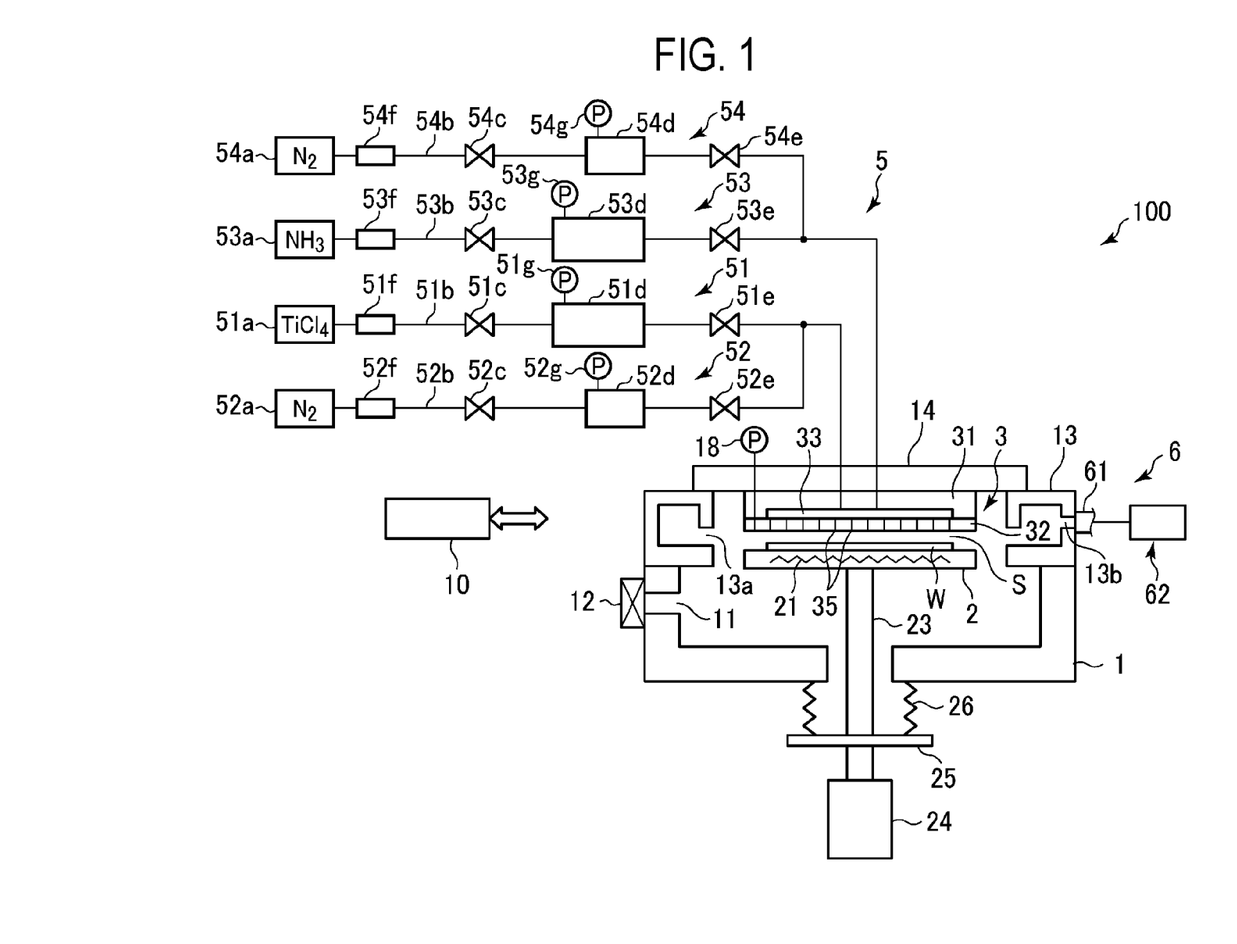
FIG. 1 is a view illustrating a schematic configuration of a substrate processing apparatus provided with a gas supply apparatus according to a first embodiment.

FIG. 1 is a view illustrating a schematic configuration of a substrate processing apparatus provided with a gas supply apparatus according to a first embodiment.

The substrate processing apparatus 100 is configured as a film forming apparatus for forming a TiN film on a semiconductor wafer (hereinafter, simply referred to as a "wafer"), which is a substrate through an ALD method using $TiCl_4$ gas which is a raw material gas and $NH_3$ gas which is a nitriding gas. The substrate processing apparatus 100 includes a processing container 1 a stage 2, a shower head 3, a gas supply apparatus 5, an exhaust part 6, and a controller 10.

The processing container 1 is made of a metal such as aluminum and has a substantially cylindrical shape. A carry-in/out port 11 for carrying in/out a wafer W therethrough is formed in the side wall of the processing container 1 and configured to be capable of being opened/closed by a gate valve 12. An annular exhaust duct 13 having a rectangular cross section is provided in the upper portion of the processing container 1. A slit 13a is formed in the exhaust duct 13 along the inner peripheral surface thereof. In addition, an exhaust port 13b is formed in the outer wall of the exhaust duct 13. A ceiling wall 14 is provided on the top surface of the exhaust duct 13.

The stage 2 has a disk shape having a size corresponding to the wafer W, and is supported by a support member 23. A heater 21 is embedded inside the stage 2 to heat a wafer W. The heater 21 is supplied with power from a heater power supply (not illustrated) to generate heat. By controlling the output of the heater 21 through a temperature signal of a thermocouple (not illustrated) provided in the vicinity of the wafer placement surface of the top surface of the stage 2, the temperature of the wafer W is controlled to a predetermined temperature.

The support member 23 configured to support the stage 2 extends from the center of the bottom surface of the stage 2 to the lower side of the processing container 1 through a hole formed in the bottom wall of the processing container 1, and the lower end of the support member 23 is connected to a lifting mechanism 24. The lifting mechanism 24 is configured to move the stage 2 between a transport position corresponding to the carry-in/out port 11 and a processing position close to the shower head 3.

A flange 25 is installed on the support member 23 below the processing container 1, and a bellows 26, which partitions the atmosphere in the processing container 1 from the outside air, is provided between the bottom surface of the processing container 1 and the flange 25 to expand and contract in response to the moving-up/down operation of the stage 2.

Wafer support pins (not illustrated) are provided near the bottom surface of the processing container 1. The wafer support pins are inserted into through holes provided in the stage 2 to be capable of protruding and retracting with respect to the top surface of the stage 2 in the transport position, so that, by moving the wafer support pins up and down, a wafer W is transferred between a wafer transport mechanism (not illustrated) and the stage 2.

The shower head 3 functions as a gas ejection part that ejects a processing gas into the processing container 1 in a shower form. The shower head 3 is formed of, for example, a metal material, has a diameter substantially the same as that of the stage 2, and is disposed to face the stage 2. The shower head 3 includes an upper member 31 and a lower member 32. The upper member 31 is fixed to the bottom surface of the ceiling wall 14. The lower member 32 is connected below the upper member 31. A diffusion space 33 for diffusing gas is formed between the upper member 31 and the lower member 32. A large number of gas ejection holes 35 are formed in the lower member 32. In the state in which the stage 2 is located at the processing position, a narrow processing space S is formed between the stage 2 and the lower member 32. The processing space S is configured such that the pressure thereof is measured by the pressure sensor 18.

The gas supply apparatus 5 is for supplying a gas used for ALD film formation to the processing space S via the shower head 3. The gas supply apparatus 5 includes a raw material gas supplier 51, a first purge gas supplier 52, a reaction gas supplier 53, and a second purge gas supplier 54. The details of the gas supply apparatus 5 will be described later.

The exhaust part 6 evacuates the interior of the processing container 1 to depressurize the interior of the processing container 1. The exhaust part 6 includes an exhaust pipe 61 and an exhaust unit 62 including an automatic pressure control valve (APC) and a vacuum pump. The exhaust pipe 61 is connected to the exhaust port 13b.

The controller 10 is configured with a computer, and includes a main controller including a CPU, an input device (e.g., a keyboard, a mouse or the like), an output device (e.g., a printer or the like), a display device (e.g., a display or the like), and a storage device (a storage medium). The main controller controls each component constituting the substrate processing apparatus 100, for example, the heater 21, the lifting mechanism 24, the automatic pressure control valve of the exhaust part 6, and the like. In particular, the controller 10 also functions as a controller of the gas supply apparatus 5, and has a function of correcting the Cv value of the ALD valve that supplies/stops gas with respect to the processing space S, as will be described later. The control operation by the controller 10 is executed by a processing recipe which is a control program stored in a storage medium (a hard disk, an optical disk, a semiconductor memory, or the like) built in the storage device.

Gas Supply Apparatus

As described above, the gas supply apparatus 5 includes a raw material gas supplier 51, a first purge gas supplier 52, a reaction gas supplier 53, and a second purge gas supplier 54. FIG. 1 illustrates schematic configurations of these parts.

The raw material gas supplier 51 includes a raw material gas source 51a, a raw material gas supply line 51b, a front-stage valve 51c, a storage tank 51d, a rear-stage valve 51e, and a flow rate controller 51f. The raw material gas source 51a supplies titanium chloride ($TiCl_4$) gas, which is an example of the raw material gas, to the shower head 3 via the raw material gas supply line 51b. The flow rate controller 51f, the front-stage valve 51c, the storage tank 51d, and the rear-stage valve 51e are interposed and installed in the raw material gas supply line 51b in this order from the raw material gas source 51a side. As the flow rate controller 51f, for example, a mass flow controller is used. The storage tank 51d temporarily stores the $TiCl_4$ gas. A pressure gauge 51g is installed in the storage tank 51d so that the pressure of the stored gas can be measured. The front-stage valve 51c is opened when the $TiCl_4$ gas is stored in the storage tank 51d, and is closed when the pressure of the storage tank 51d is raised. The rear-stage valve 51e is configured as an ALD valve, and is an opening/closing valve that supplies/stops gas at high speed during ALD.

In the raw material gas supplier 51, the processing gas is stored in the storage tank 51d before the supply of the $TiCl_4$ gas is started. At this time, the front-stage valve 51c is opened in the state in which the rear-stage valve 51e is closed. As a result, the $TiCl_4$ gas is introduced into the storage tank 51d until a target pressure is reached. Next, the front-stage valve 51c is closed, and the rear-stage valve 51e is opened. As a result, the $TiCl_4$ gas in the storage tank 51d is supplied to the processing space S. After the supply, the rear-stage valve 51e is closed, and the front-stage valve 51c is opened again, so that the $TiCl_4$ gas is stored in the storage tank 51d. By repeating this, the $TiCl_4$ gas is supplied during an ALD process. By providing the storage tank 51d in this way, the $TiCl_4$ gas can be supplied at a high pressure, so that it becomes easy to obtain a flow rate required for the ALD process.

The opening/closing operations of the front-stage valve 51c and the rear-stage valve 51e are controlled by a valve controller (not illustrated in FIG. 1) provided for each valve based on a control command from the controller 10. In addition, the pressure control of the storage tank 51d is also performed based on a control command from the controller 10.

The first purge gas supplier 52 includes a first purge gas source 52a, a first purge gas supply line 52b, a front-stage valve 52c, a storage tank 52d, a rear-stage valve 52e, and a flow rate controller 51f. The first purge gas source 52a supplies nitrogen ($N_2$) gas, which is an example of a purge gas, via the first purge gas supply line 52b. The first purge gas supply line 52b is connected to the raw material gas supply line 51b. The flow rate controller 52f, the front-stage valve 52c, the storage tank 52d, and the rear-stage valve 52e are interposed and installed in the first purge gas supply line 52b in this order from the first purge gas source 52a side. The storage tank 52d is provided with a pressure gauge 52g. The flow rate controller 52f, the front-stage valve 52c, the storage tank 52d, the rear-stage valve 52e, and the pressure gauge 52g are configured in the same manner as the flow rate controller 51f, the front-stage valve 51c, the storage tank 51d, the rear-stage valve 51e, and the pressure gauge 51g. In addition, the gas supply by the first purge gas supplier 52 can be performed in the same manner as the raw material gas supplier 51. The first purge gas supplier 52 may supply $N_2$ gas, which is the purge gas, continuously during the ALD process.

The reaction gas supplier 53 includes a reaction gas source 53a, a reaction gas supply line 53b, a front-stage valve 53c, a storage tank 53d, a rear-stage valve 53e, and a flow rate controller 53f. The reaction gas source 53a supplies ammonia ($NH_3$) gas, which is a nitriding gas, to the shower head 3 as an example of the reaction gas via the reaction gas supply line 53b. The flow rate controller 53f, the front-stage valve 53c, the storage tank 53d, and the rear-stage valve 53e are interposed and installed in the reaction gas supply line 53b in this order from the reaction gas source 53a side. The storage tank 53d is provided with a pressure gauge 53g. The flow rate controller 53f, the front-stage valve 53c, the storage tank 53d, the rear-stage valve 53e, and the pressure gauge 53g are configured in the same manner as the flow rate controller 51f, the front-stage valve 51c, the storage tank 51d, the rear-stage valve 51e, and the pressure gauge 51g. In addition, another reaction gas supply line branched from the reaction gas supply line 53b extending from the reaction gas source 53a is provided, and a front-stage valve, a storage tank, and a rear-stage valve are provided in the line, so that $NH_3$ gas, which is a reaction gas (nitriding gas), may be supplied at different flow rates. In addition, the gas supply by the reaction gas supplier 53 can be performed in the same manner as the raw material gas supplier 51.

The second purge gas supplier 54 includes a second purge gas source 54a, a second purge gas supply line 54b, a front-stage valve 54c, a storage tank 54d, a rear-stage valve 54e, and a flow rate controller 54f. The second purge gas source 54a supplies nitrogen ($N_2$) gas, which is an example of a purge gas, via the second purge gas supply line 54b. The second purge gas supply line 54b is connected to the reaction gas supply line 53b. The flow rate controller 54f, the front-stage valve 54c, the storage tank 54d, and the rear-stage valve 54e are interposed and installed in the second purge gas supply line 54b in this order from the second purge gas source 54a side. The storage tank 54d is provided with a pressure gauge 54g. The flow rate controller 54f, the front-stage valve 54c, the storage tank 54d, the rear-stage valve 54e, and the pressure gauge 54g are configured in the same manner as the flow rate controller 51f, the front-stage valve 51c, the storage tank 51d, the rear-stage valve 51e, and the pressure gauge 51g. In addition, the gas supply by the second purge gas supplier 54 can be performed in the same manner as the raw material gas supplier 51. The second purge gas supplier 54 may supply $N_2$ gas, which is the purge gas, continuously during the ALD process.

Figure 2:
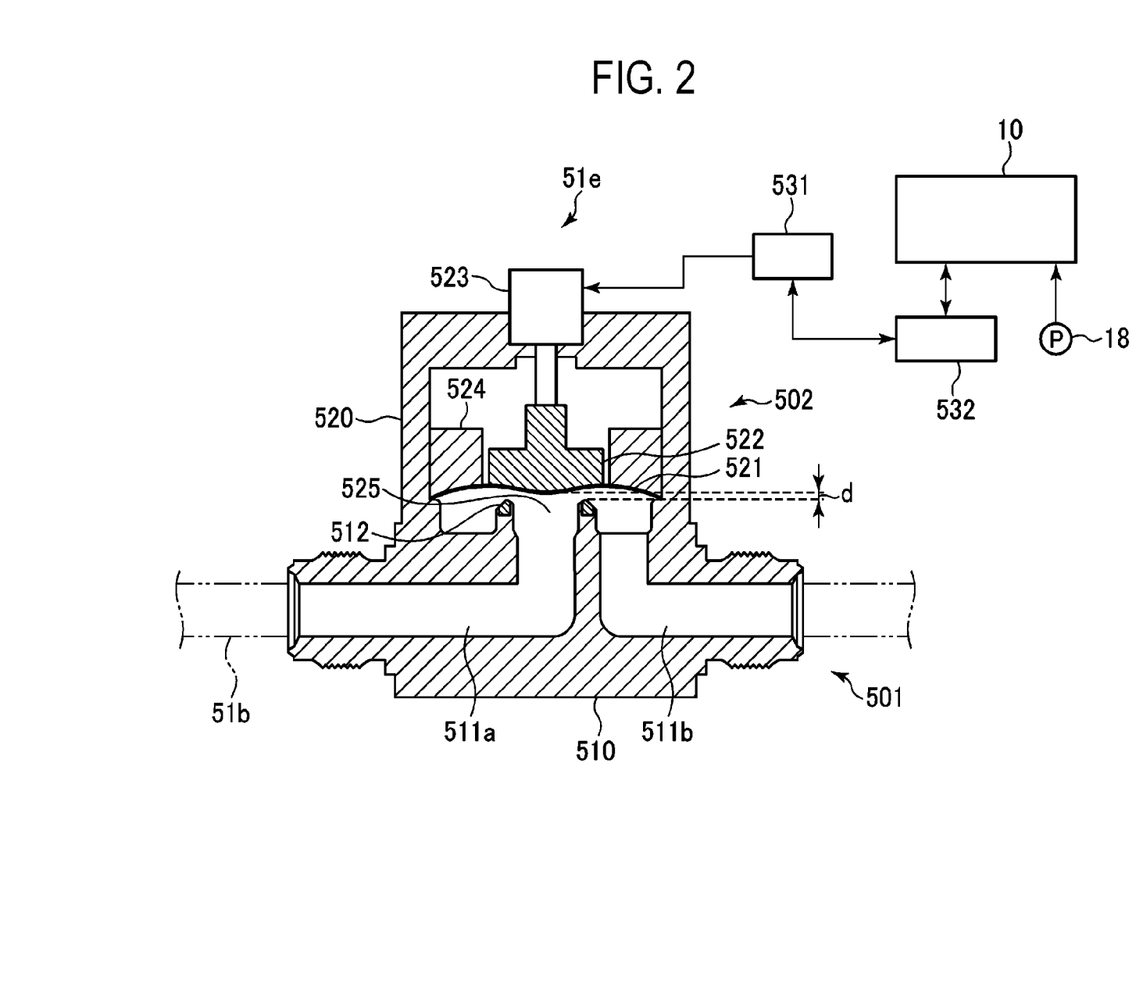
FIG. 2 is a view illustrating a portion including a rear-stage valve, which is a main part of a raw material gas supplier of a gas supply apparatus according to an embodiment.

Next, among the respective gas suppliers constituting the gas supply apparatus 5, the main part thereof will be described in detail by taking the raw material gas supplier 51 as an example. FIG. 2 is a view illustrating a portion including a rear-stage valve 51e, which is a main part of the raw material gas supplier 51. As illustrated in FIG. 2, the present embodiment is characterized by the control of the rear-stage valve 51e, which is an ALD valve.

FIG. 2 illustrates an example in which the rear-stage valve 51e is configured as a direct diaphragm valve, and the valve is in an opened state. The rear-stage valve 51e includes a lower portion 501 and an upper portion 502. The lower portion 501 includes a main body 510, and the main body 510 is provided with an inflow side internal flow path 511a and an outflow side internal flow path 511b. The main body 510 is interposed in the raw material gas supply line 51b. The inflow side internal flow path 511a extends from an inflow port along the longitudinal direction of the main body 510 and is curved upward in the vicinity of the center of the main body 510. The outflow side internal flow path 511b extends from the outflow port along the longitudinal direction of the main body 510 and is curved upward in the vicinity of the center of the main body 510. A ring-shaped valve seat 512 is provided at the upper end of the curved portion of the inflow side internal flow path 511a. As the valve seat 512, a resin having a high sealing property may be used. From the viewpoint of improving wear resistance, the valve seat 512 may be made of a fluororesin having high wear resistance, such as PFA, and a fluororesin, such as a wear resistant ring made of PFA may be provided adjacent to the valve seat 512. A metal seal may be used.

The upper portion 502 includes a cylindrical housing portion 520 extending upward from the central portion of the lower portion 501. A diaphragm 521, which is a sealing member for sealing the valve seat 512, is provided at a position directly above the valve seat 512 inside the housing portion 520. The outer peripheral portion of the diaphragm 521 is supported by a step portion provided in the housing portion 520. A piston 522 is disposed above the diaphragm 521 inside the housing portion 520, and the central portion thereof is welded to the diaphragm 521. The piston 522 is moved up and down by an actuator 523. The diaphragm 521 moves up and down following the vertical movement of the piston 522, and is brought into contact with and separated from the valve seat 512 to open and close the valve. As illustrated in FIG. 2, in the opened state in which the diaphragm 521 is separated from the valve seat 512 while the piston 522 is raised, the valve chamber 525 is formed so that the inflow side internal flow path 511a and the outflow side internal flow path 511b communicate with each other. In addition, a tubular body 524 is provided in the upper portion of the diaphragm 521 in the inner peripheral portion of the housing portion 520. The actuator 523 is driven by the driver 531 so that the height of the piston 522 can be adjusted. Therefore, the lift amount d from the valve seat 512 of the diaphragm 521 in the state in which the rear-stage valve 51e is opened, that is, the valve opening degree can be adjusted.

Figure 3:
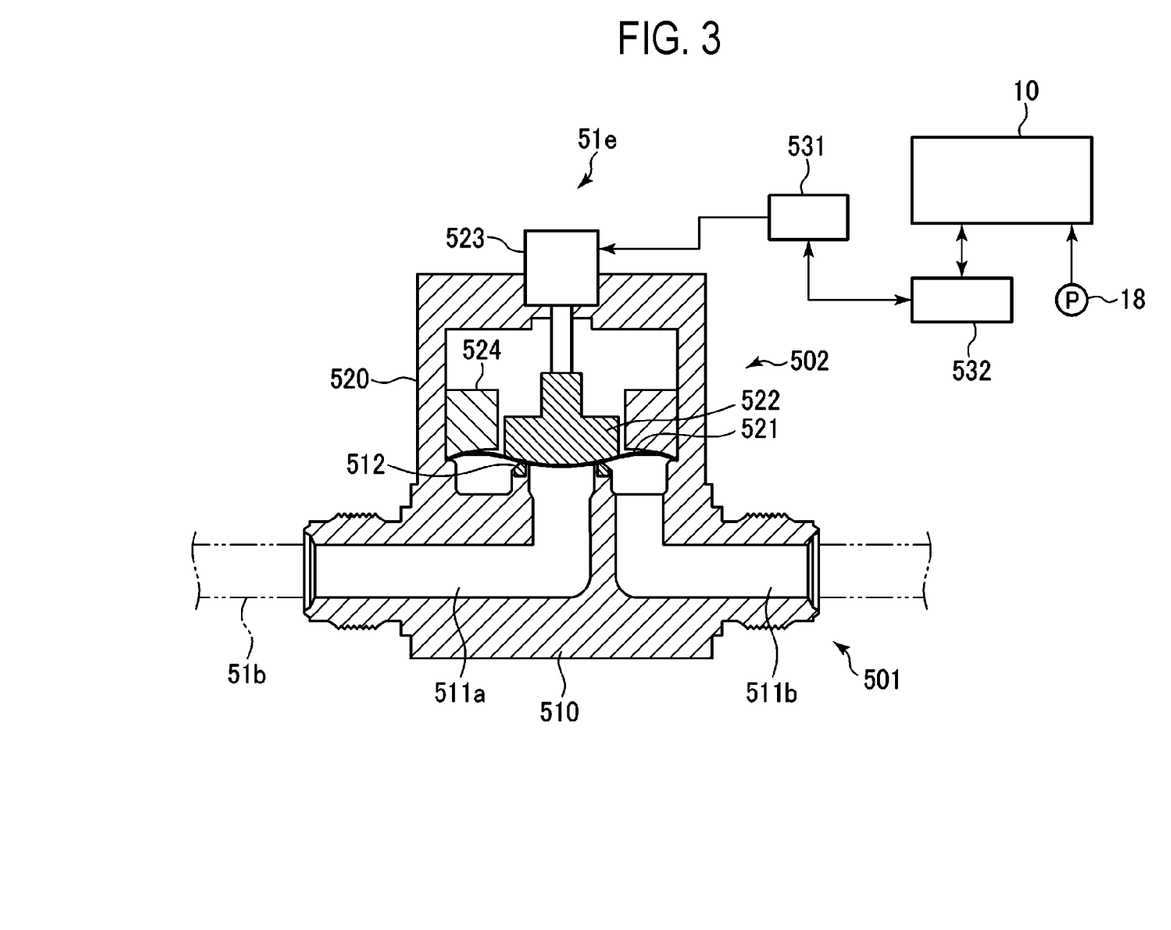
FIG. 3 is a view illustrating a state in which the rear-stage valve illustrated in FIG. 2 is closed.

FIG. 3 illustrates a state in which the rear-stage valve 51e is closed, the piston 522 is lowered by the actuator 523, and the diaphragm 521 is in close contact with the valve seat 512. The surface of the diaphragm 521 on the valve seat 512 side may be coated with a fluororesin having high wear resistance, for example, PFA.

A piezo element may be used as the actuator 523. Since a piezo valve using the piezo element as the actuator 523 can be operated at a high speed and the opening degree thereof can be easily adjusted, the piezo valve is suitable for the rear stage valve 51e used as the ALD valve.

A control signal is transmitted from the valve controller 532 to the driver 531 that drives the actuator 523, and the valve opening/closing operation by the actuator 523 and the opening degree when the valve is opened are controlled. In addition, the driver 531 sends the position information of the piston 522 (the diaphragm 521), that is, information of the valve opening degree to the valve controller 532. The position information of the piston 522 may be sent to the valve controller 532 from a position sensor provided separately. The information acquired by the valve controller 532 is transmitted to the controller 10, and a control signal is transmitted from the controller 10 to the valve controller 532.

Figure 4:
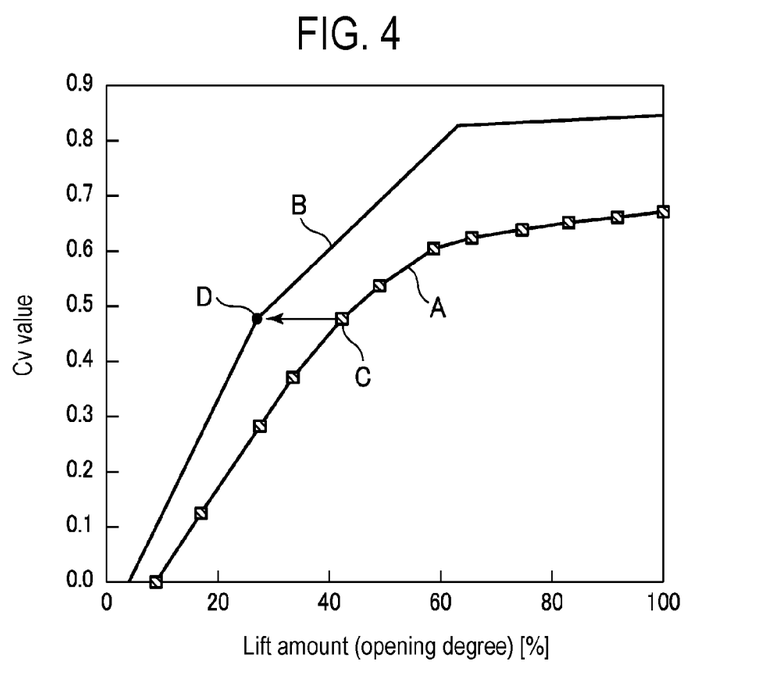
FIG. 4 is a view showing a relationship between a lift amount of a diaphragm (a valve opening degree) of a rear-stage valve and a Cv value of the valve.

The relationship between the lift amount of the diaphragm 521 (valve opening degree) of the rear-stage valve 51e and the Cv value of the valve is determined according to the diameter of the diaphragm 521 (the diameter of the valve seat 512), and has, for example, the relationship indicated by line A in FIG. 4.

When the rear-stage valve 51e is repeatedly opened and closed, the Cv value increases due to the wear of the valve seat 512 and the like. In the case in which the Cv value becomes large, when the lift amount of the diaphragm 521 (the opening of the valve) is set as it is, the gas supply amount when the valve is opened increases. Therefore, the lift amount of the diaphragm 521 (valve opening degree) is controlled to be suitable for the new Cv value. Specifically, when the Cv value of the valve becomes large due to the wear of the valve seat 512 or the like and becomes as illustrated by the line B in FIG. 4, the lift amount (valve opening degree) is controlled to be the lift amount (valve opening degree) corresponding to the same Cv value on the line B. For example, it is assumed that the lift amount of the diaphragm 521 (valve opening degree) and the Cv value of the valve is the point C on the line A in the initial state. When the Cv value increases due to the wear and shifts to the line B, the lift amount of the diaphragm 521 (valve opening degree) is controlled to be the point D having the Cv value equivalent to the Cv value at point C.

The Cv value is the capacity coefficient of a valve, and refers to a value representing the capacity of the valve when the valve is fully opened at a certain front-rear differential pressure. The larger the Cv value, the larger the flow rate of a fluid at the same differential pressure. The Cv value is expressed by a relational expression of a flow rate Q and a front-rear differential pressure ΔP (in this example, the pressure difference between the pressure of the pressure gauge 51g of the storage tank and the pressure of the pressure sensor 18 provided in the processing space S). Therefore, by monitoring a detectable index correlated with the Cv value by an appropriate detection means, it is possible to identify a change in the Cv value due to the wear of the rear-stage valve 51e.

Then, the controller 10 stores the relationship between the Cv value of the rear-stage valve 51e and the detectable index correlated with the Cv value, and when the index deviates from the appropriate range corresponding to the appropriate Cv value, the lift amount of the diaphragm 521 (valve opening degree) is controlled such that the index is within the appropriate range.

The detectable index correlated with the Cv value may be, for example, the pressure value of the processing space S that is the pressure in a portion downstream of the rear-stage valve 51e and obtained by the pressure sensor 18. The pressure value in a portion downstream of the rear-stage valve 51e is not limited to the pressure of the processing space S, and may be the pressure value of a portion of the raw material gas supply line 51b downstream of the rear-stage valve 51e.

Specifically, taking the case in which the pressure of the pressure sensor 18 is used as a detectable index correlated with the Cv value, the relationship between the Cv value of the rear-stage valve 51e and a value detected by the pressure sensor 18 are stored in the controller 10, and a change in the Cv value is detected using a change in the pressure of the pressure sensor 18. That is, the pressure value corresponding to an appropriate Cv value in the initial state of the rear-stage valve 51e is stored in the controller 10 as an appropriate range, and when the pressure value deviates from the appropriate range corresponding to the appropriate Cv value, the lift amount of the diaphragm 521 (valve opening degree) is controlled such that the pressure value falls within the appropriate range. This makes it possible to suppress fluctuation in the gas supply amount when the Cv value of the rear-stage valve 51e changes due to the wear of the valve seat 512 or the like.

As the pressure value to be monitored, a pressure waveform when the rear-stage valve 51e is opened may be used. When an ALD process is performed as in the present embodiment, the rear-stage valve 51e is opened and closed at a high speed to supply a gas in a pulse shape, and the pressure in the processing space S pulsates accordingly. Therefore, the pressure waveform corresponding to one pulse of the ALD process may be used as the pressure value to be monitored.

The rear-stage valves 52e, 53e, and 54e are configured in the same manner as the rear-stage valve 51e, and the lift amount of the diaphragm (valve opening degree) is controlled in the same manner.

Operation of Substrate Processing Apparatus

Next, the operation (film forming operation) of the substrate processing apparatus 100 configured as described above will be described.

First, the gate valve 12 is opened, a wafer W is carried into the processing container 1 through the carry-in/out port 11 and placed on the stage 2 by a transport apparatus (not illustrated), the transport apparatus is retracted, and the stage 2 is raised to the processing position. Then, the gate valve 12 is closed, the interior of the processing container 1 is maintained in a predetermined depressurized state, and the temperature of the stage 2 is controlled by the heater 21 at a film formation temperature, for example, in the range of 400 to 550 degrees C.

In this state, $N_2$ gas is supplied from the first purge gas supplier 52 and the second purge gas supplier 54 as a purge gas to the processing space S via the shower head 3 to purge the processing space S. Thereafter, the ALD process is performed.

In the ALD process, respective gases are sequentially supplied from the gas supply apparatus 5 to the processing space S in the processing container 1 via the shower head 3 in a pulsed form.

Figure 5:
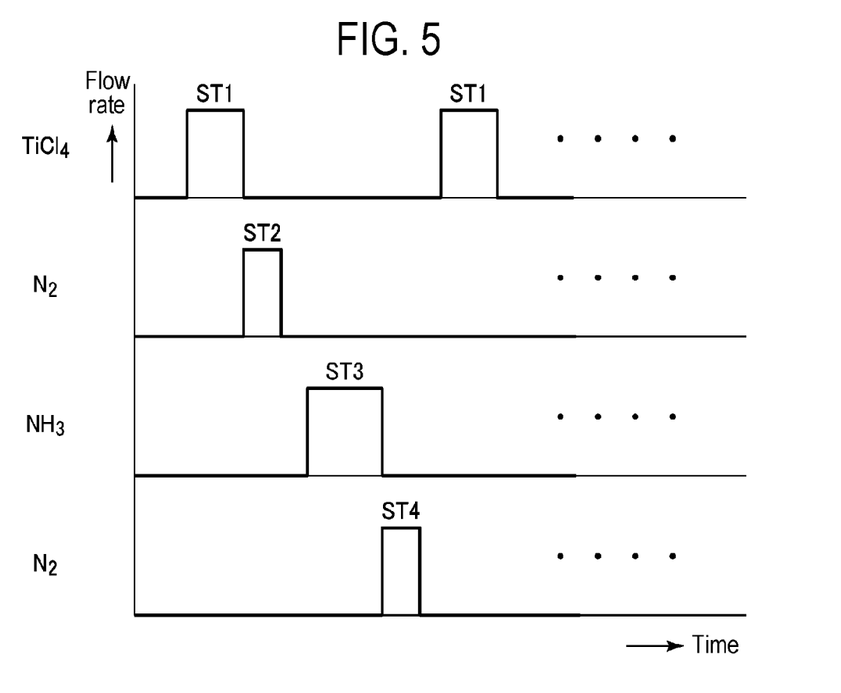
FIG. 5 is a timing chart illustrating gas supply in an ALD process.

Specifically, as illustrated in the gas supply timing chart of FIG. 5, first, the raw material gas supplier 51 supplies $TiCl_4$ gas, which is a raw material gas, to the processing space S (ST1). As a result, the TiCl$_4$ gas is adsorbed on the surface of the wafer W. Next, N$_2$ gas, which is a purge gas, is supplied to the processing space S from the first purge gas supplier 52 (ST2). As a result, the TiCl$_4$ gas is discharged from the processing space S. In this purge step of ST2, evacuation is performed after supplying the N$_2$ gas, which is a purge gas. Thereafter, NH$_3$ gas, which is a reaction gas (nitriding gas), is supplied to the processing space S from the reaction gas supplier 53 (ST3). As a result, the NH$_3$ gas is reacted with the TiCl$_4$ gas adsorbed on the surface of the wafer W to form a thin TiN film. Next, N$_2$ gas, which is a purge gas, is supplied to the processing space S from the second purge gas supplier 54 (ST4). As a result, NH$_3$ gas is discharged from the processing space S. In this purge step of ST4, evacuation is performed after supplying the N$_2$ gas, which is a purge gas.

A TiN film having a set film thickness is formed by repeating such ST1 to ST4 as one cycle a desired number of times.

When such an ALD process is repeated, in particular, the rear-stage valves 51e to 54e, which are ALD valves, are repeatedly opened and closed at a high speed, causing wear on the valve seats and the like, and the Cv values of the valves change. When the Cv value of a valve changes in this way, the gas supply amount may fluctuate, and the film formation result may fluctuate. Therefore, as a technique for preventing a change in a film formation result due to a change in the Cv value of a valve, Patent Document 1 proposes a technique for calculating the Cv value of a valve by executing a correction recipe for confirming the Cv value.

In contrast, in the present embodiment, for example, the Cv value of the rear-stage valve 51e is monitored using a detectable index correlated with the Cv value, for example, the pressure in a portion downstream of the rear-stage valve 51e, such as the pressure of the processing space S. By monitoring such an index, it is possible to identify a change in the Cv value of the valve due to wear or the like. Then, when the detectable index correlated with the Cv value deviates from an appropriate range corresponding to an appropriate Cv value, the lift amount of the diaphragm 521 (valve opening degree) is controlled such that the index falls within the appropriate range. Taking the case in which the pressure of the pressure sensor 18 is used as a detectable index correlated with the Cv value as an example, a change in the Cv value is detected as a change in the pressure of the pressure sensor 18. Then, when the pressure value deviates from the appropriate range corresponding to the appropriate Cv value, the lift amount of the diaphragm 521 (valve opening degree) is controlled such that the pressure value falls within the appropriate range. This makes it possible to suppress fluctuation in the gas supply amount when the Cv value of the rear-stage valve 51e changes due to the wear of the valve seat 512 or the like. That is, it is possible to easily suppress the fluctuation of a gas flow rate due to a change in the Cv value of the valve without executing a correction recipe as in Patent Document 1. As for the rear-stage valve, which is an ALD valve, the fluctuation of a gas flow rate due to a change in the Cv value of the valve can be suppressed in this way, so that the fluctuation of the film formation result of the ALD process can be suppressed.

The pressure value to be monitored may be the pressure value when the valve is opened, but may also be a pressure waveform when the valve is opened or closed. When an ALD process is performed as in the present embodiment, the rear-stage valve 51e is opened and closed at a high speed to supply a gas in a pulse shape, and the pressure in the processing space S pulsates accordingly. Therefore, by using a pressure waveform corresponding to one pulse of the ALD process as a pressure value to be monitored, it is possible to cope with the fluctuation of a gas supply amount due to a change in the Cv value of a valve with high accuracy.

Second Embodiment

Figure 6:
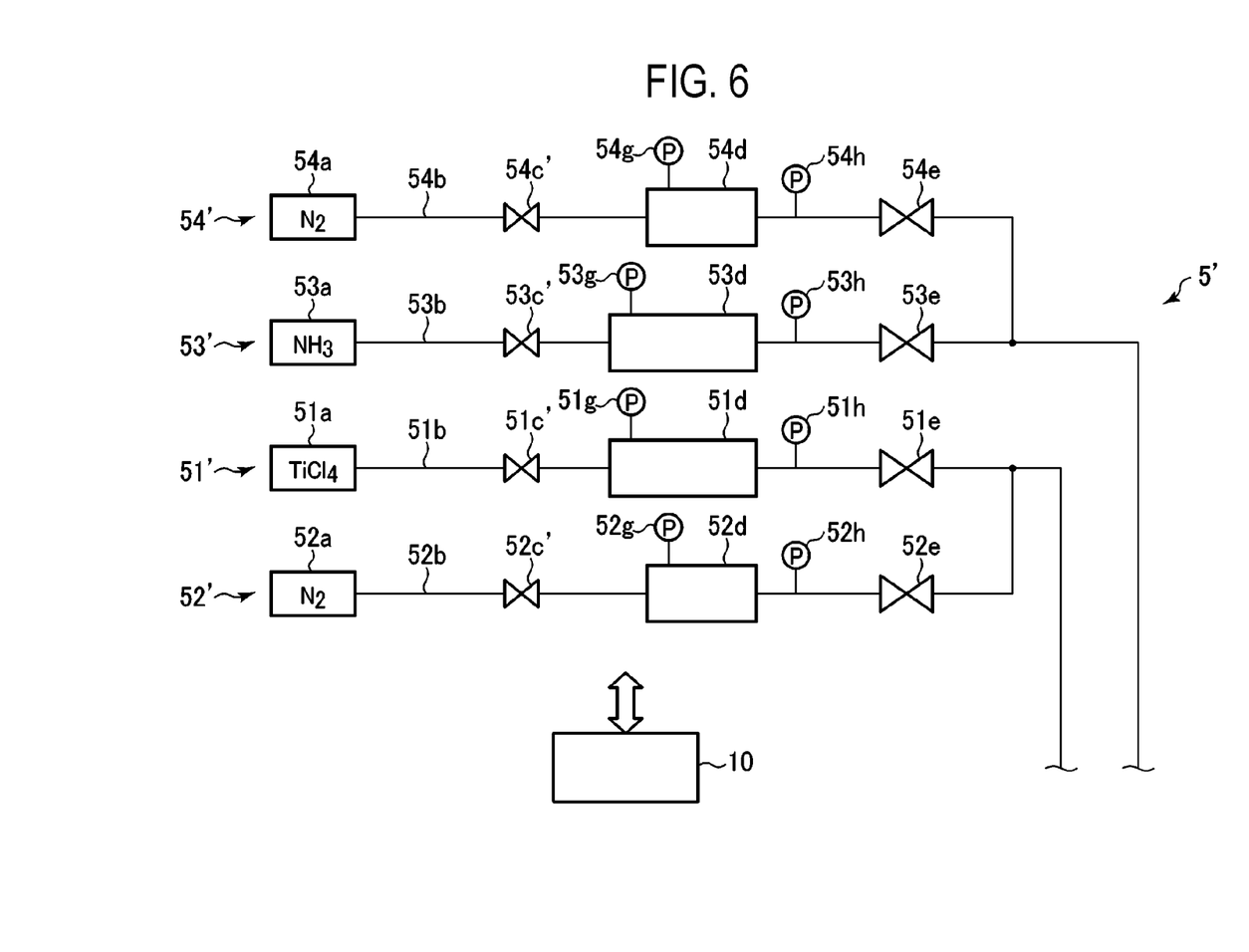
FIG. 6 is a view illustrating a schematic configuration of a gas supply apparatus according to a second embodiment.

FIG. 6 is a block diagram illustrating a gas supply apparatus according to a second embodiment. The gas supply apparatus 5' of the present embodiment is able to control a flow rate without using a flow rate controller such as a mass flow controller, and to control a waveform of a gas flow rate.

The gas supply apparatus 5' is for supplying a gas used for ALD film formation to a processing space S via a shower head 3, as in the first embodiment. The gas supply apparatus 5' includes a raw material gas supplier 51', a first purge gas supplier 52', a reaction gas supplier 53', and a second purge gas supplier 54'.

The raw material gas supplier 51' includes a raw material gas source 51a, a raw material gas supply line 51b, a front-stage valve 51c', a storage tank 51d, and a rear-stage valve 51e. The storage tank 51d is provided with a first pressure gauge 51g, and a second pressure gauge 51h is provided in the raw material gas supply line 51b downstream of the storage tank 51d. The raw material gas supplier 51' differs from the raw material gas supplier 51 in that the former is not provided with the flow rate controller 51f, the front-stage valve 51c' performs not only an opening/closing operation as in the front-stage valve 51c, but also the adjustment of an opening degree, and the former includes a second pressure gauge 51h. That is, the front-stage valve 51c' functions as an adjustment valve for adjusting the opening degree. As the front-stage valve 51c', a valve, of which the opening degree can be adjusted at a high speed, is preferable, and a piezo valve described with reference to FIG. 2 may be preferably used.

The raw material gas supplier 51' is able to calculate a flow rate based on the measured value of the first pressure gauge 51g and the measured value of the second pressure gauge 51h. Specifically, when the rear-stage valve 51e is opened in the state in which the front-stage valve 51c' is closed, the flow rate of the gas flowing into the storage tank 51d is 0, and the flow velocity of the gas at the installation position of the first pressure gauge 51g may be regarded as 0. Under this condition, the gas flow velocity v$_2$ at the measurement position of the second pressure gauge 51h may be obtained by the following Equation 1 based on Bernoulli's theorem relating to a compressible fluid.

[Equation 1]

$$v_2 = \left[ \frac{2\gamma}{\gamma-1} \cdot \frac{p_1}{\rho_1} \left\{ 1 - \left( \frac{p_2}{p_1} \right)^{(\gamma-1)/\gamma} \right\} \right]^{\frac{1}{2}} \quad (1)$$

where p$_1$ is a pressure at the measurement position of the first pressure gauge 51g, p$_2$ is a pressure at the measurement position of the second pressure gauge 51h, ρ$_1$ is the density of the gas in the storage tank 51d, and γ is the specific heat ratio of the gas. The gas flow rate may be calculated by multiplying the flow velocity v$_2$ obtained in this way by the cross-sectional area of the pipe.

In addition, by providing a thermometer for measuring the temperature of the gas in the storage tank 51d instead of the second pressure gauge 51h, the flow rate of the gas can be calculated based on a state equation in a non-ideal gas, $PV=nZRT$ (where n is the molar amount of the gas, P is a pressure amount, V is the volume of the storage tank $51d$, Z is a compression coefficient of the gas (TiCl$_4$ gas which is the raw material gas in this example), R is the ideal gas constant and equals to 1.987 cal/(mol·K), and T is an absolute temperature (K)). That is, since the flow rate of the gas is a change in the molar amount n (mol) of the processing gas per unit time in the storage tank $51d$, the gas flow rate Q can be obtained by the following equation based on the above-mentioned state equation of state.

$$Q=(\Delta n/\Delta t)=(\Delta P/\Delta t)V/ZRT \text{ (where } t \text{ is time)}$$

In the raw material gas supplier 51', a first gas supply mode as in the raw material gas supplier 51 of the first embodiment and a second gas supply mode in which a flow rate waveform is controllable may be executed.

Figure 7:
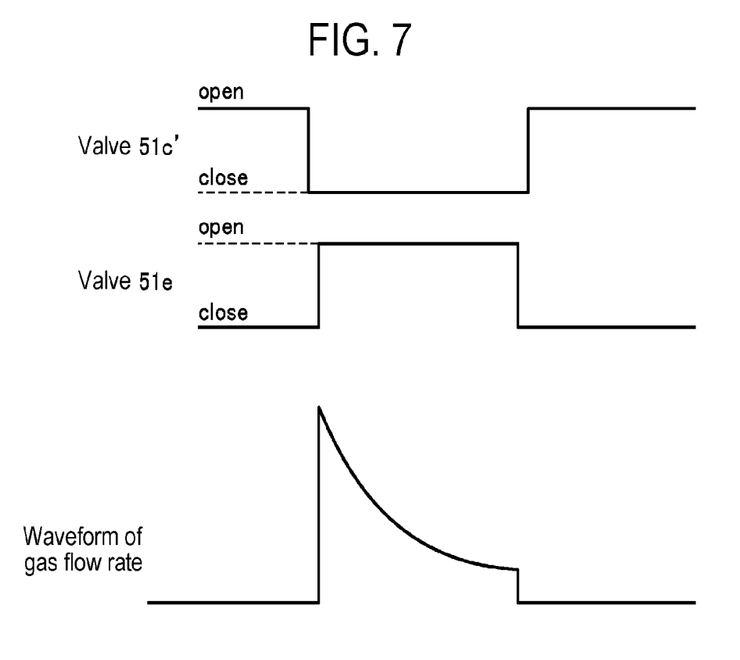
FIG. 7 is a view illustrating opened/closed states of a front-stage valve and a rear-stage valve and a gas flow rate waveform when $TiCl_4$ gas is supplied in a first gas supply mode in the second embodiment.

In the first gas supply mode, before the supply of TiCl$_4$ gas is started, the front-stage valve $51c'$ is opened in the state in which the rear-stage valve $51e$ closed so that the TiCl$_4$ gas is introduced into the storage tank $51d$, and the front-stage valve $51c'$ is closed at the time at which the target pressure is reached. In that state, the rear-stage valve $51e$ is opened to supply the TiCl$_4$ gas to the processing space S. After the supply, the rear-stage valve $51e$ is closed and the front-stage valve $51c'$ is opened again to store the TiCl$_4$ gas in the storage tank $51d$. By repeating this, the TiCl$_4$ gas is supplied during the ALD process. In this case, as illustrated in FIG. 7, since the front-stage valve $51c'$ is closed when the rear-stage valve $51e$ is opened to supply the gas, the TiCl$_4$ gas flows at once at a high flow rate in the initial stage at which the pressure of the storage tank $51d$ is high. Therefore, the pressure of the storage tank $51d$ drops sharply, and as a result, the flow rate of the TiCl$_4$ gas also forms a flow rate waveform in which the flow rate drops sharply. Therefore, it is difficult to form a waveform that sustains a desired flow rate based on a processing recipe for a desired time. Such a problem also exists in the raw material gas supplier 51 of the first embodiment.

Figure 8:
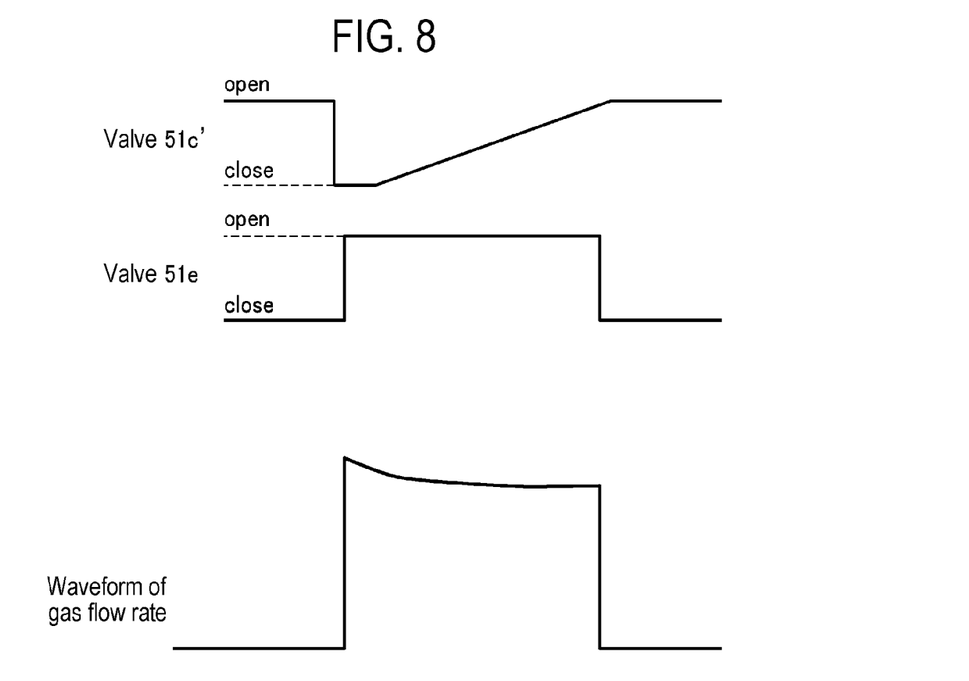
FIG. 8 is a view illustrating an opening degree of a front-stage valve, opened/closed state of a rear-stage valve, and a gas flow rate waveform when $TiCl_4$ gas is supplied in a second gas supply mode in the second embodiment.

In contrast, in the second gas supply mode, before the supply of TiCl$_4$ gas is started, the front-stage valve $51c'$ is opened in the state in which the rear-stage valve $51e$ closed so that the TiCl$_4$ gas is introduced into the storage tank $51d$, and the front-stage valve $51c'$ is closed at the time at which the target pressure is reached. Up to this point, the second gas supply mode is the same as the first gas supply mode. However, in the second gas supply mode, the opening degree of the front-stage valve $51c'$ is controlled during the period in which the rear-stage valve $51e$ is opened to supply the TiCl$_4$ gas to the processing space S. This makes it possible to control the gas flow rate waveform of one pulse in the ALD process based on the processing recipe. For example, as illustrated in FIG. 8, by gradually increasing the opening degree of the front-stage valve $51c'$ during the supply period of the TiCl$_4$ gas, the pressure drop in the storage tank $51d$ is suppressed, and thus it is possible to control the flow rate waveform of the TiCl$_4$ gas in the period of one pulse to a substantially constant value.

The opening/closing operations of the front-stage valve $51c'$ and the rear-stage valve $51e$ are controlled by a valve controller (not illustrated in FIG. 6) provided for each valve based on a control command from the controller 10. In addition, the pressure control of the storage tank $51d$ is also performed based on a control command from the controller 10.

In the present embodiment as well, as in the first embodiment, for the rear-stage valve $51e$ that supplies/stops gas, a change in the Cv value due to wear of the valve seat or the like is identified by monitoring a detectable index correlated with the Cv value, for example, the pressure in the processing space S. Then, when the detectable index correlated with the Cv value deviates from an appropriate range corresponding to an appropriate Cv value, the lift amount of the diaphragm 521 (valve opening degree) is controlled such that the index falls within the appropriate range. In the present embodiment as well, as in the first embodiment, the pressure value in a portion downstream of the rear-stage valve $51e$, for example, the pressure in the processing space S may be used as the detectable index correlated with the Cv value.

The first purge gas supplier 52' includes a first purge gas source $52a$, a first purge gas supply line $52b$, a front-stage valve $52c'$, a storage tank $52d$, and a rear-stage valve $52e$. The storage tank $52d$ is provided with a first pressure gauge $52g$, and a second pressure gauge $52h$ is provided in the first purge gas supply line $52b$ downstream of the storage tank $52d$. The front-stage valve $52c'$ is configured in the same manner as the front-stage valve $51c'$. The detailed configuration of the first purge gas supplier 52' is the same as that of the raw material gas supplier 51'.

The reaction gas supplier 53' includes a reaction gas source $53a$, a reaction gas supply line $53b$, a front-stage valve $53c'$, a storage tank $53d$, and a rear-stage valve $53e$. The storage tank $53d$ is provided with a first pressure gauge $53g$, and a second pressure gauge $53h$ is provided in the reaction gas supply line $53b$ downstream of the storage tank $53d$. The front-stage valve $53c'$ is configured in the same manner as the front-stage valve $51c'$. The detailed configuration of the reaction gas supplier 53' is the same as that of the raw material gas supplier 51'.

The second purge gas supplier 54' includes a second purge gas source $54a$, a second purge gas supply line $54b$, a front-stage valve $54c'$, a storage tank $54d$, and a rear-stage valve $54e$. The storage tank $54d$ is provided with a first pressure gauge $54g$, and a second pressure gauge $54h$ is provided in the second purge gas supply line $54b$ downstream of the storage tank $54d$. The front-stage valve $54c'$ is configured in the same manner as the front-stage valve $51c'$. The detailed configuration of the second purge gas supplier 54' is the same as that of the raw material gas supplier 51'.

In the present embodiment as well, in film formation, first, the gate valve 12 is opened, a wafer W is carried into the processing container 1 through the carry-in/out port 11 and placed on the stage 2 by a transport apparatus (not illustrated), the transport apparatus is retracted, and the stage 2 is raised to the processing position. Then, the gate valve 12 is closed, the interior of the processing container 1 is maintained in a predetermined depressurized state, and the temperature of the stage 2 is controlled by the heater 21 at a film formation temperature, for example, in the range of 400 to 550 degrees C.

In this state, as in the first embodiment, N$_2$ gas is supplied as purge gas from the first purge gas supplier 52' and the second purge gas supplier 54' to the processing space S via the shower head 3 to purge the processing space S. Thereafter, respective gases are sequentially supplied in a pulsed manner from the gas supply apparatus 5' to the processing space S in the processing container 1 via the shower head 3, and the ALD process is carried out. Specifically, as in the first embodiment, as illustrated in the gas supply timing chart of FIG. 5, a step of supplying TiCl$_4$ gas (ST1), a step of supplying N$_2$ gas (ST2), a step of supplying NH$_3$ gas (ST3), and a step of supplying N₂ gas (ST4) are repeated a desired number of times. As a result, a TiN film having a set film thickness is formed.

As in the first embodiment, the present embodiment responds a change in the Cv values of valves due to wear of valve seats or the like caused by repeated high-speed opening and closing of the rear-stage valves 51e to 54e. For example, the Cv value of the rear-stage valve 51e is monitored using a detectable index correlated with the Cv value, for example, the pressure in a portion downstream of the rear-stage valve 51e, such as the pressure of the processing space S. By monitoring such an index, it is possible to identify a change in the Cv value of the valve due to wear or the like. Then, when the detectable index correlated with the Cv value deviates from an appropriate range corresponding to an appropriate Cv value, the lift amount of the diaphragm 521 (valve opening degree) is controlled such that the index falls within the appropriate range. This makes it possible to suppress fluctuation in the gas supply amount when the Cv value of the rear-stage valve 51e changes due to the wear of the valve seat 512 or the like. As a detectable index correlated with the Cv value, for example, the pressure in the processing space S detected by the pressure sensor 18 may be used.

As described above, in the present embodiment as well, it is possible to easily suppress the fluctuation of the gas flow rate due to a change in the Cv value of a valve without executing a correction recipe as in Patent Document 1. As for the rear-stage valve, which is an ALD valve, the fluctuation of a gas flow rate due to a change in the Cv value of the valve can be suppressed in this way, so that the fluctuation of the film formation result of the ALD process can be suppressed.

In the present embodiment, in addition to this point, in the second gas supply mode, the opening degree of the front-stage valve 51c' is controlled during the period in which the rear-stage valve 51e is opened to supply the TiCl₄ gas to the processing space S. This makes it possible to control the gas flow rate waveform of one pulse in the ALD process based on the processing recipe. For example, as illustrated in FIG. 8 described above, it is possible to control the supply amount of TiCl₄ gas during the period of one pulse to a substantially constant value. This makes it possible to supply the gas with higher accuracy. In addition, since it is possible to control the waveform of the gas flow rate supplied to the wafer W during the ALD process, it is possible to control the amount of the gas exposed to the wafer W with high accuracy, and thus it is possible to suppress variations in film thickness, step coverage, and the like between wafers and apparatuses. In addition, since it is possible to control the supply amount of TiCl₄ gas during the period of one pulse to a substantially constant value, it is possible to increase a step coverage. Further, since it is possible to control the flow rate without providing a flow rate controller such as a mass flow controller in the gas supply apparatus 5', the apparatus can be downsized.

Other Applications

Although embodiments have been described above, it should be considered that the embodiments disclosed herein are exemplary in all respects and are not restrictive. The embodiments described above may be omitted, replaced, or modified in various forms without departing from the scope and spirit of the appended claims.

For example, in the above-described embodiments, a pressure detected by a pressure sensor provided downstream of a rear-stage valve that supplies/stops gas, for example, in the processing space, is used as a detectable index correlated with the Cv value, but the present disclosure is not limited thereto. For example, the pressure of the storage tank provided upstream of the rear-stage valve may be used.

In the above-described embodiments, a direct diaphragm valve is illustrated as an example of a rear stage valve which is an opening/closing that supplies/stops gas, but the present disclosure is not limited thereto.

In the above-described embodiments, a gas supply apparatus applied to an ALD process is illustrated, but a gas supply apparatus may be applied to a CVD process. Further, gas processing other than film formation may be used.

In the above-described embodiments, a case in which TiCl₄ gas is used as a raw material gas and NH₃ gas which is a nitriding gas is used as a reaction gas to form a TiN film has been described, but the present disclosure is not limited thereto.

In addition, the substrate processing apparatus illustrated in FIG. 1 is merely an example, and a single wafer film forming apparatus having a structure different from that of FIG. 1 or a batch type film forming apparatus for forming a film on plural substrates at once may be applicable. In addition, a substrate processing apparatus other than a film forming apparatus may also be applicable.

Furthermore, in the embodiments described above, a semiconductor wafer has been described as an example of a substrate to be processed, but the substrate is not limited to the semiconductor wafer, and may be another substrate, such as a glass substrate used for a flat panel display (FPD) or a ceramic substrate.

According to the present disclosure, it is possible to provide a gas supply apparatus, a gas supply method, and a substrate processing apparatus that can easily suppress fluctuation in a gas supply amount due to changes in the Cv value of an opening/closing valve for supplying/stopping gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas supply apparatus that supplies a gas to a processing space in which a gas processing is performed on a substrate, the gas supply apparatus comprising:
    a gas supply source configured to supply a gas;
    a gas supply path configured to supply the gas from the gas supply source to the processing space;
    a storage tank configured to temporarily store the gas and provided in a portion of the gas supply path;
    an opening/closing valve configured to supply/stop the gas and provided in the gas supply path downstream of the storage tank;
    a detector configured to detect a detectable index correlated with a Cv value of the opening/closing valve;
    an opening degree adjuster configured to adjust an opening degree of the opening/closing valve when the opening/closing valve is opened; and
    a controller configured to: store a relationship between the Cv value of the opening/closing valve and the index;

and control the opening degree of the opening/closing valve by the opening degree adjuster such that when the index deviates from an appropriate range corresponding to an appropriate Cv value, the index falls within the appropriate range,
wherein the index is detected at a portion downstream of the opening/closing valve.

2. The gas supply apparatus of claim 1, wherein the detector is further configured to monitor the index based on the appropriate range.

3. The gas supply apparatus of claim 1, wherein the detector is a pressure sensor configured to detect a pressure value as the index.

4. The gas supply apparatus of claim 3, wherein the pressure sensor is further configured to detect the pressure value of the processing space.

5. The gas supply apparatus of claim 4, wherein the pressure sensor is configured to detect, as the pressure value, a pressure waveform when the opening/closing valve is opened.

6. The gas supply apparatus of claim 4, wherein the gas processing is an ALD process.

7. The gas supply apparatus of claim 6, wherein the pressure sensor is further configured to detect a pressure waveform of one pulse of the ALD process.

8. The gas supply apparatus of claim 6, further comprising:
an adjustment valve provided upstream of the storage tank and configured to be capable of adjusting the opening degree of the adjustment valve,
wherein the controller is further configured to control a waveform of a gas flow rate by adjusting the opening degree of the adjustment valve while opening the opening/closing valve and supplying the gas from the storage tank to the processing space.

9. A substrate processing apparatus that performs a gas processing on a substrate, the substrate processing apparatus comprising:
a processing container including therein a processing space configured to process the substrate;
a gas supply apparatus configured to supply a gas to the processing space; and
an exhaust part configured to evacuate the processing space,
wherein the gas supply apparatus includes:
a gas supply source configured to supply the gas;
a gas supply path configured to supply the gas from the gas supply source to the processing space;
a storage tank configured to temporarily store the gas and provided in a portion of the gas supply path;
an opening/closing valve configured to supply/stop the gas and provided in the gas supply path downstream of the storage tank;
a detector configured to detect a detectable index correlated with a Cv value of the opening/closing valve;
an opening degree adjuster configured to adjust an opening degree of the opening/closing valve when the opening/closing valve is opened; and
a controller configured to: store a relationship between the Cv value of the opening/closing valve and the index; and control the opening degree of the opening/closing valve by the opening degree adjuster such that when the index deviates from an appropriate range corresponding to an appropriate Cv value, the index falls within the appropriate range,
wherein the index is detected at a portion downstream of the opening/closing valve.

10. The substrate processing apparatus of claim 9, wherein the gas processing is an ALD process, and
the detector is a pressure sensor configured to detect a pressure waveform of one pulse of the ALD process in the processing space as the index.

11. The substrate processing apparatus of claim 10, further comprising:
an adjustment valve provided upstream of the storage tank and configured to be capable of adjusting the opening degree of the adjustment valve,
wherein the controller is further configured to control a waveform of a gas flow rate by adjusting the opening degree of the adjustment valve while opening the opening/closing valve and supplying the gas from the storage tank to the processing space.

12. A gas supply method that supplies a gas to a processing space in which a gas processing is performed on a substrate, the gas supply method comprising:
providing a gas supply apparatus including a gas supply source configured to supply a gas, a gas supply path configured to supply the gas from the gas supply source to the processing space, a storage tank configured to temporarily store the gas and provided in a portion of the gas supply path, an opening/closing valve configured to supply/stop the gas and provided in the gas supply path downstream of the storage tank, a detector configured to detect a detectable index correlated with a Cv value of the opening/closing valve, and an opening degree adjuster configured to adjust an opening degree of the opening/closing valve when the opening/closing valve is opened;
detecting the index at a portion downstream of the opening/closing valve;
identifying a relationship of the Cv value of the opening/closing valve and the index; and
controlling the opening degree of the opening/closing valve by the opening degree adjuster such that when the index deviates from an appropriate range corresponding to an appropriate Cv value, the index falls within the appropriate range.

13. The gas supply method of claim 12, wherein the detector monitors the index based on the appropriate range.

14. The gas supply method of claim 12, wherein a pressure sensor is used as the detector, and the pressure sensor detects a pressure value as the index.

15. The gas supply method of claim 14, wherein the pressure sensor detects the pressure value of the processing space.

16. The gas supply method of claim 15, wherein the pressure sensor detects, as the pressure value, a pressure waveform when the opening/closing valve is opened.

17. The gas supply method of claim 15, wherein the gas processing is an ALD process.

18. The gas supply method of claim 17, wherein the pressure sensor detects a pressure waveform of one pulse of the ALD process.

19. The gas supply method of claim 17, wherein an adjustment valve configured to be capable of adjusting an opening degree of the adjustment valve is provided upstream of the storage tank, and a waveform of a gas flow rate is controlled by adjusting the opening degree of the adjustment valve while opening the opening/closing valve and supplying the gas from the storage tank to the processing space.

* * * * *